United States Patent [19]
Tanguy et al.

[11] Patent Number: 5,036,522
[45] Date of Patent: Jul. 30, 1991

[54] SEMICONDUCTOR LASER WITH LOCALIZATION OF CURRENT

[75] Inventors: Christian Tanguy, Saint-Michel; Guy Mesquida, Forges Les Bains; Gerard-Maurice Marquebielle, Sainte Geneviéve des Bois, all of France

[73] Assignee: Thomson Hybrides, Puteaux, France

[21] Appl. No.: 527,942

[22] Filed: May 24, 1990

[30] Foreign Application Priority Data

Jun. 2, 1989 [FR] France .................. 89 07309

[51] Int. Cl.$^5$ .............................. H01S 3/19
[52] U.S. Cl. ......................... 372/46; 372/45; 372/44
[58] Field of Search .................. 374/45, 46, 44

[56] References Cited

FOREIGN PATENT DOCUMENTS 0273730 7/1988 European Pat. Off. .
2225855 11/1974 France .

OTHER PUBLICATIONS

Patent Abstracts of Japan, vol. 7, No. 194 (E-195) (1339), Aug. 24, 1983; & JP-A-58 96 791, Jun. 8, 1983, O. Ueda, "Manufacturing of Semiconductor Light-Emitting Device".
IEEE Electron Device Letters, vol. EDL-1, May, 1980, No. 5, pp. 75-78, D. Kasemset et al., "$Pb_{1-x}Sn_xTe/PbTe_{1-y}Se_y$ Lattice-Matched Buried Heterostructure Lasers with CW Single Mode Output".
Applied Physics Letters, vol. 40, No. 3, Feb. 1982, pp. 208-210, C. S. Hong et al., "High-Efficiency, Low-Threshold, Zn-Diffused Narrow Stripe GaAS/-GaAIAs Double Heterostructure Lasers Grown by Metalorganic Chemical Vapor Deposition".
Patent Abstracts of Japan, vol. 11, No. 61 (E-483) (2508), Feb. 25, 1987; & JP-A-61 220 392, Sep. 30, 1986, H. Kawada, "Semiconductor Light-Emitting Element".

Primary Examiner—Georgia Epps
Attorney, Agent, or Firm—Oblon, Spivak, McClelland, Maier & Neustadt

[57] ABSTRACT

The disclosure concerns semiconductor lasers in which the current has to be localized, preferably in the emissive strip. In a laser having at least one emissive strip and a contact for current injection, the current is localized on the strip by means of an overdoped well that goes through the confinement layer with doping gradient. This confinement layer is doped to a level of $10^{18}$ at.cm$^{-3}$ in the vicinity of the strip and to a level of $2.10^{17}$ at.cm$^{-3}$ in the vicinity of the injection contact. The disclosed device can be applied to telecommunications and data processing by optical fibers.

4 Claims, 1 Drawing Sheet

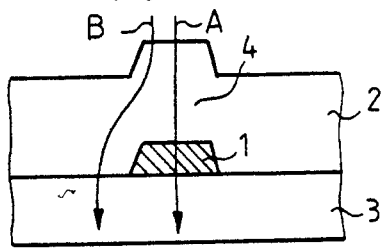
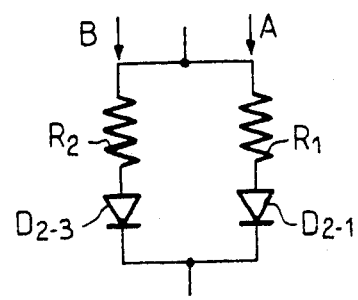
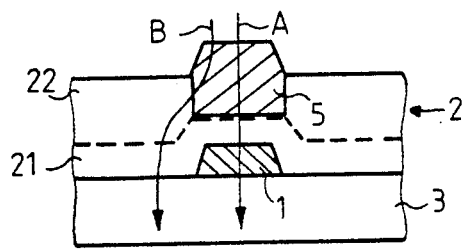
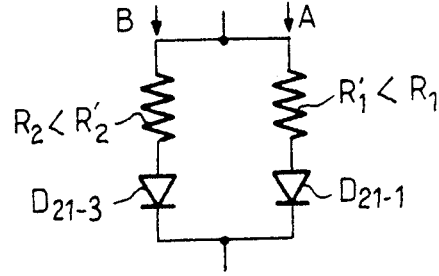
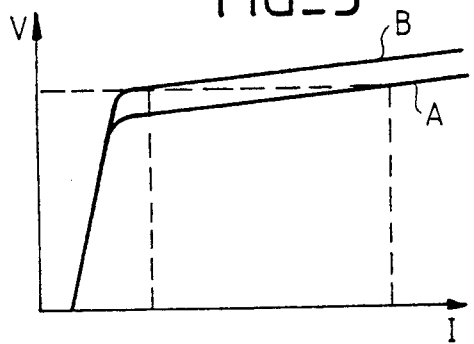
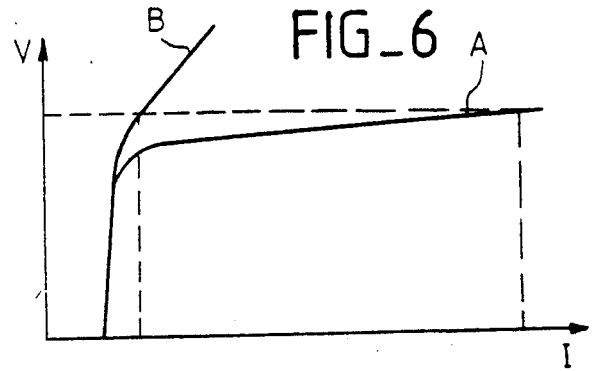
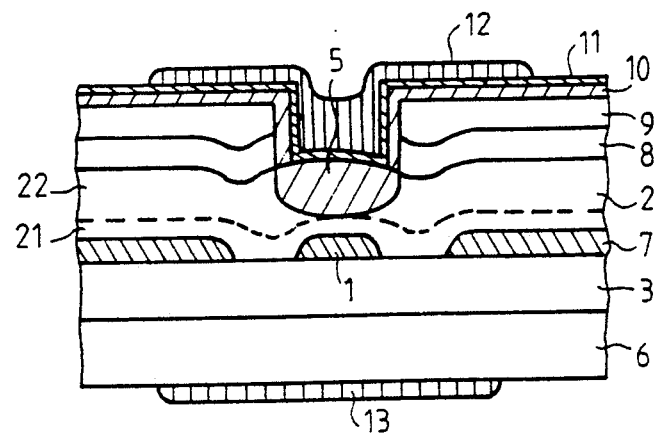

5,036,522

SEMICONDUCTOR LASER WITH LOCALIZATION OF CURRENT

BACKGROUND OF THE INVENTION

1. Field of the Invention

The present invention concerns an improvement made in the structure of a semiconductor laser so as to improve the localization of the current that flows through the emissive strip of the laser.

2. Description of the Prior Art

It is known that a semiconductor laser includes at least one light-emitting layer, called an active layer, placed between two confinement layers. In the active layer, a strip is defined by etching: it is this layer which, in forming a Fabry-Perot cavity, emits a coherent light beam through its two cleaved faces at the ends of the strip.

The current injected from a contact layer, adjacent to a confinement layer, towards the substrate, adjacent to another confinement layer, creates the emission of light by the active layer. One of the problems of light-emitting semiconductor devices is that of localizing the current injection in the region of the strip alone, i.e. limiting it to this region.

A known approach consists in defining the injection of current in the layer by means of a reverse biased junction which stretches around the active strip and thus circumscribes it and counters the passage of the current. However, the making of a junction, during fabrication, calls for an additional epitaxy (by localized growth) and this considerably complicates the making of the device.

Another simple known approach consists in making two parallel diodes, one homojunction diode and one heterojunction diode, with the difference in the voltages corresponding to the flexion point on the characteristic curve enabling the injection of current preferably in the diode with the lower threshold voltage. It is therefore the heterojunction diode, formed between two confinement layers and the active layer, that favors the passage of the current through the etched strip. This is valid for a low current but, at high currents, the current flowing in the homojunction diode is no longer negligible. Furthermore, the efficiency of the confinement of the current is diminished when the temperature rises.

This is illustrated by the FIGS. 1, 2 and 3 pertaining to the prior art.

FIG. 1 is deliberately limited to that region alone of a laser which is necessary for understanding the operation: the substrate, the auxiliary layers and the biasing metallizations are not shown.

Let us take an emissive strip 1 between a first layer of confinement 2, made of InP with P type doping, and a second confinement layer 3, made of InP with N type doping, for example. In this case, the strip 1 is made of GaInAsP, for example. The diode with low threshold voltage is formed by the heterojunction 2-1-3 formed by InP, GaInAsP and InP, and the diode with the higher threshold voltage is formed by the homojunction 2-3 between P type and N type InP.

The current that flows through the layers goes through the heterojunction diode (channel A) and the homojunction diode (channel B). The equivalent electrical diagram is given in FIG. 2: the resistance of access $R_2$ to the homojunction diode $D_{2-3}$ is substantially the same as the resistance of access $R_1$ to the heterojunction diode $D_{2-1}$. Only the voltages corresponding to the flexion point of their characteristic curves are different. If it is desired to increase $R_2$ by lower doping of the semiconductor material on the channel B, $R_1$ is also increased because the semiconductor material is less doped at 4, on the channel A of access to the strip 1, and the leakage current of the homojunction is increased.

The curves of V(I) for these two diodes are given in FIG. 3: at high currents, the leakage current through the channel B is excessive as compared with the current in the channel A. The curves of the two diodes are substantially parallel to each other.

The invention provides an improvement to this device for the localization of the current injected into the emissive strip, by creating a preferred path for the current, by means of a localized diffusion of zinc, right on the strip, in a semiconductor confinement layer which itself has a doping gradient that decreases with distance from the emissive strip.

SUMMARY OF THE INVENTION

More precisely, the invention concerns a semiconductor laser comprising at least one emissive strip sandwiched between two confinement layers, and at least one current injection metallization, wherein the confinement layer between the emissive strip and the current injection metallization has a gradient of doping that decreases towards the metallization, and wherein a diffusion of zinc through said confinement layer creates a preferred localization of the current through the emissive strip of the laser.

BRIEF DESCRIPTION OF THE DRAWINGS

The invention will be understood more clearly from the following more detailed description, made with reference to the appended drawing, wherein:

FIGS. 1, 2 and 3 pertaining to a prior art laser diode have been explained above;

FIG. 4 shows a simplified sectional view of the core of a laser according to the invention;

FIG. 5 shows an equivalent electrical diagram of a laser according to FIG. 4;

FIG. 6 shows a curve of the lateral leakage current for a laser according to FIG. 4;

FIG. 7 shows a sectional view of a laser according to the invention.

To make the comparison easier, FIG. 4, unlike FIG. 1, takes up only that part of the core of the laser needed for the explanations, namely an emissive strip 1 between two confinement layers 2 and 3.

DESCRIPTION OF A PREFERRED EMBODIMENT

However, the first novelty of the invention, as compared with FIG. 1, is that the upper confinement layer 2 between the emissive strip 1 and the current injection contact has a doping gradient, changing from a doping level of $10^{18}$ at.cm$^{-3}$ in the region 21 neighboring the homojunction 2-3 up to a level of $2.10^{17}$ at.cm$^{-3}$ in the region 22 close to the interface 22-B. This confinement layer has a thickness of the order of 1.5 to 1.8 $\mu$m and it is preferably deposited epitaxially by metalorganic chemical vapor deposition (MOCVD) or by molecular beam epitaxy (MBE) for these types of epitaxy enable a doping gradient to be obtained.

The second novelty according to the invention lies in an access well 5, obtained by localized diffusion of zinc right on the emissive strip 1 in the active layer. The doping by zinc is done to the level of $10^{18}$ at.cm$^{-3}$. This diffusion descends until it makes contact with (or at least gets very close to) the region 21 of the confinement layer 2 which lies over the emissive strip 1: this region 21 is doped to between $2.10^{18}$ and $10^{18}$ at.cm$^{-3}$. There is therefore continuity of doping of at least $10^{18}$ at.cm$^{-3}$ between the biasing metallization and the emissive strip 1, thus creating a preferred path of localization of the current in the laser.

The equivalent schematic diagram of the laser according to the invention, given in FIG. 5, differs from the diagram of the laser according to the prior art in that:

for the channel A of localization of the current, the resistance $R'_1$ (of the invention) is lower than the resistance $R_1$ (of the prior art) because of the well which is doped to a level of at least $10^{18}$ at.cm$^{-3}$;

for the channel B of the leakage current, the resistance $R'_2$ (of the invention) is greater than the resistance $R_2$ (of the prior art) because the access layer at 22 is doped gradually between $10^{18}$ at.cm$^{-3}$ and $2.10^{17}$ at.cm$^{-3}$ only, and because the homojunction 21-3 has a greater potential barrier.

Moreover, the overdoping in the region 21 has the following effects, shown in FIG. 6:

it flattens out the slope of the curve V(I) of the channel A as compared with that of the channel B;

it relatively straightens out the slope of the curve V(I) of the channel B of the homojunction 21-3 diode as compared with the slope of the same curve for the channel A.

Consequently, for the same value of the voltage V, to obtain a high current in the laser channel A), the leakage current is proportionally far lower (channel B), because the two curves are no longer almost parallel to each other as in the prior art.

FIG. 7 shows a more detailed sectional view of a laser according to the invention. By way of a non-restrictive example, it comprises:

a substrate 6 made of N doped InP;
a second confinement layer 3, made of N doped InP;
an active layer 7, made of GaInAsP, in which an emissive strip 1 has been etched;
a first confinement layer 2, made of P doped InP, with a thickness of 1.5 to 1.8 μm, obtained by epitaxial growth through MOCVD or MBE. Its region 21, in contact with the emissive strip 1, is doped to a level of $10^{18}/7.10^{17}$ at.cm$^{-3}$, and its region 22 is doped to the level of $2 \times 10^{17}$ at.cm$^3$;

A ternary layer 8, made of GaInAs, with a thickness of 0.1 μm, to favor a differential chemical attack (with weak P type doping to a level of $2.10^{17}$ at.cm$^{-3}$);
a barrier layer 9, made of N doped InP.

This structure is partially etched, right on the emissive strip 1, to reach the contact layer 8 and, after the necessary masking operations, a well 5 is diffused, by doping with zinc to a level of $10^{18}$ at.cm$^{-3}$. The well 5 is deep enough to come into contact with the overdoped region 21 right on the emissive strip 1. During the zinc diffusion, the surface region 10 of the blocking layer 9 is also diffused.

The laser is completed by a metallization 11 of Pt/Au for the P contact, for current injection, reinforced with an access layer 12 made of electrolytic gold and, beneath the substrate 6, by a metallization 13 of Au-Mo-Au for the N contact.

It is clear that the detailed structure and the materials of the layers may be different from those chosen to explain the invention, without going beyond the framework defined by the following claims.

This type of laser is used in telecommunications or data processing by optical fibers.

What is claimed is:

1. In a semiconductor laser comprising at least one emissive strip sandwiched between two confinement layers, and at least one current injection metallization, wherein the first confinement layer above the emissive strip and below the current injection metallization has a gradient of doping that decreases towards the metallization, and wherein a diffusion of zinc through said first confinement layer creates a well providing a preferred localization of current through the emissive strip of the laser.

2. In a semiconductor laser according to claim 1, wherein the doping of said first confinement layer decreases from $10^{18}$ at.cm$^{-3}$ in the region close to the emissive strip to $2.10^{17}$ at.cm$^{-3}$ in the region close to the current injection metallization.

3. A laser semiconductor according to claim 1, wherein said well that goes through said first confinement layer is doped to the level of $10^{18}$ at.cm$^{-3}$.

4. A semiconductor laser according to claim 1, wherein said well diffused in said first confinement layer is in contact with the overdoped region of said first confinement layer, thereby setting up an electrical continuity between the current injection metallization and the emissive strip.

* * * * *